(12) United States Patent
Pon et al.

(10) Patent No.: US 9,484,280 B2
(45) Date of Patent: Nov. 1, 2016

(54) SEMICONDUCTOR DEVICE AND METHOD OF MANUFACTURING A SEMICONDUCTOR DEVICE

(71) Applicant: Infineon Technologies Austria AG, Villach (AT)

(72) Inventors: Tiam Meng Pon, Melaka (MY); Tian San Tan, Melaka (MY); Theng Chao Long, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 378 days.

(21) Appl. No.: 14/153,003

(22) Filed: Jan. 11, 2014

(65) Prior Publication Data
US 2015/0200148 A1    Jul. 16, 2015

(51) Int. Cl.
| | |
|---|---|
| H01L 23/34 | (2006.01) |
| H01L 23/367 | (2006.01) |
| H01L 21/48 | (2006.01) |
| H01L 23/13 | (2006.01) |
| H01L 23/14 | (2006.01) |
| H01L 23/31 | (2006.01) |
| H01L 23/495 | (2006.01) |
| H01L 23/467 | (2006.01) |

(52) U.S. Cl.
CPC ......... *H01L 23/367* (2013.01); *H01L 21/4878* (2013.01); *H01L 23/13* (2013.01); *H01L 23/14* (2013.01); *H01L 23/3157* (2013.01); *H01L 23/49503* (2013.01); *H01L 23/49541* (2013.01); *H01L 23/49568* (2013.01); *H01L 23/3107* (2013.01); *H01L 23/467* (2013.01); *H01L 2924/0002* (2013.01)

(58) Field of Classification Search
CPC ...................................................... H01L 23/34
See application file for complete search history.

(56) References Cited

U.S. PATENT DOCUMENTS 6,195,256 B1 * 2/2001 Tiziani .................. H01L 23/367
165/80.2
2006/0255362 A1 11/2006 Otremba

* cited by examiner

*Primary Examiner* — Marvin Payen (57) ABSTRACT

A semiconductor device is provided, wherein the semiconductor device comprises a carrier, wherein the carrier comprises a first portion configured to hold a semiconductor chip; and a second portion configured for mounting the semiconductor device to a support, the second portion further comprising a first feature configured to be connected to the support; and at least one second feature configured to facilitate transfer of heat away from the first portion, wherein the at least one second feature increases a surface area of the second portion.

14 Claims, 5 Drawing Sheets

SEMICONDUCTOR DEVICE AND METHOD OF MANUFACTURING A SEMICONDUCTOR DEVICE

TECHNICAL FIELD

Various embodiments relate to semiconductor devices and to a method of manufacturing a semiconductor device.

BACKGROUND

Methods of manufacturing semiconductor devices may include disposing a bare chip or die over a plate, e.g. a leadframe or a printed circuit board PCB, and adhering a mold or encapsulation material over the bare chip and to the plate. It may also be possible to encapsulate the chip first by the mold compound and then afterwards disposing the chip package or package over the plate or substrate. Usually, the chip will produce some heat during operation which has to be dissipated or lead off the package. For dissipating the heat typically a heat sink is attached to the chip package or forms a part of the package itself.

SUMMARY

Various embodiments provide a semiconductor device, wherein the semiconductor device comprises a carrier, wherein the carrier comprises a first portion configured to hold a semiconductor chip; and a second portion configured for mounting the semiconductor device to a support, the second portion further comprising a first feature configured to be connected to the support; and at least one second feature configured to facilitate transfer of heat away from the first portion, wherein the at least one second feature increases a surface area of the second portion.

Furthermore, various embodiments provide a semiconductor device comprising a carrier which comprises a holding area configured to hold a semiconductor chip; and a heat dissipation area comprising a planar surface, wherein the heat dissipation area comprises at least two interruptions in the planar surface.

Moreover, various embodiments provide a method for manufacturing a semiconductor device, wherein the method comprises providing a carrier comprising a first portion configured to hold a semiconductor chip and a second portion configured for mounting the semiconductor device to a support; and forming at least one feature in the second portion wherein the at least one feature is configured to facilitate transfer of heat away from the first portion, wherein the at least one feature increases a surface area of the second portion.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which.

DETAILED DESCRIPTION

In the following further exemplary embodiments of a semiconductor device and a method of manufacturing a semiconductor device will be explained. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various embodiments provide a heat sink for a chip, wherein the heat sink comprises a body comprising a first major surface and a second major surface, wherein the second major surface is adapted to be exposed to a fluidic medium; and wherein the second major surface comprises at least two surface structures, e.g. recess structures, increasing a surface area of the second major surface. In particular, a first major surface and a second major surface of the heat sink or the body of the heat sink may be opposing major surfaces.

In particular, the heat sink or the carrier may comprise or may consist of a material having a thermal conductivity above a predetermined threshold, e.g. above 1 W/(m*K), preferably above 10 W/(m*K) and more preferably above 50 W/(m*K) or even above 100 W/(m*K). For example, the carrier may comprise a metal or a thermal conductive plastic material. In particular, the first portion may have a flat or planar surface. The carrier may be substantially a plate, i.e. a body having extensions in two dimensions which are substantial larger compared to the extension in the third dimension, e.g. the height. The height of the semiconductor device including the carrier may not be changed due to the provision of the second feature, e.g. a surface structure, on the second portion of the carrier. In particular, the carrier may be formed of or may be part of a leadframe on which the chip may be arranged. In particular, a portion of the leadframe or carrier may form the so called die paddle of a leadframe or chip reception area, i.e. the portion of the leadframe the chip or die is attached to, while another portion of the lead frame may form the heat sink.

The terms "second feature" which increases a surface area may particularly denote any feature or structure which is willingly or arbitrarily formed on or in a surface. It thus has to be distinguished from normal or typical surface irregularities, e.g. small projections and indentation, present in any formed bodies and representing the typical surface roughness. The features or surface structures may also be denoted as macroscopic surface structures or willingly formed structures while the typical surface roughness which is inherent to any forming or manufacturing process of a body may be denoted as microscopic structures.

The term "increased surface area" may particularly denote that the surface area is willingly increased by forming surface structures or recess structures in or on that surface area so that the surface area is afterwards larger than it was before the surface structures were formed. In other words a large scale roughness of the surface may be increased as well. Such surface structures may also be denoted as interruptions in a planar surface of the portions of the carrier.

The provision of such surface structures, like features, interruptions of a planar surface, recess structures or holes, for increasing the surface area of a portion of a carrier or a major surface of a carrier may increase the ability to dissipate or convey heat by convection to a fluidic medium, i.e. a liquid or gaseous medium, e.g. air, surrounding the semiconductor device or portions thereof. Additional the chip itself may not have to be adapted in layout and/or the assembly process may not have to be amended or modified in case surface structures are provided on a portion of the carrier. Additionally, the provision of an increased surface for a portion of a carrier may increase the performance of the chip package or package, due to improved heat dissipation by convection to the surrounding environment.

According to an exemplary embodiment of the semiconductor device the first portion of the carrier comprises a flat surface. In particular, the flat surface may form a major surface of the first portion. Such a flat surface may be adapted to be contacted to a substrate, e.g. an external substrate which is external to the semiconductor device of which the carrier may be a part or component. For example, the substrate may be a printed circuit board, an external heat sink or any other suitable substrate. In particular, a substantially flat or planar surface may be defined as a surface which does not have any substantial surface structures or features increasing the surface area compared to a flat structure or increasing the roughness. However, small surface irregularities, in particular small projections present in any formed body, e.g. normal surface roughness, may be present at the first surface as well. But the surface may be free of any willingly or arbitrarily formed surface structures increasing the surface area.

According to an exemplary embodiment of the semiconductor device the second portion of the carrier comprises a plurality of second features.

In particular, the plurality of second features may be a plurality of surface structures or interruptions of the planar surface, e.g. recess structures, and may be arranged in a pattern, e.g. a regular or an irregular pattern. For example, the plurality of recess structures or holes may form concave holes. Sidewalls of the holes may be straight or inclined depending on the use and on the easiness of forming the holes. The provision of recess structures as surface increasing features or structures may be advantageously, since the height or thickness of the carrier and/or semiconductor device may not be increased although the surface area which can be used for heat convection may be increased. Furthermore, the provision of recess structures, e.g. compared to projections as surface area increasing structures, may reduce the amount of material to be used for the carrier in the second portion. Thus, material and costs may be reduced depending on the material used for the carrier.

According to an exemplary embodiment of the semiconductor device at least one of the plurality of second features is a blind hole.

In particular, one or several or all of the plurality of second features or recess structures may be blind holes or recess structures. The use of blind holes for the second features may allow for providing the second portion with a flat first major surface and a second major surface having features (recesses/blind holes) which increase the surface area. While the flat first major surface may enable the connection or contact area to a substrate the second major surface may have an increased surface area enabling improved heat dissipation via convection. Typical dimensions for the blind holes may be 1.5 mm to 3.5 mm in length, 0.5 mm to 2 mm in width and 0.1 mm to 0.5 mm in depth for rectangular blind holes. The term "recess structure" may particular denote a surface structure which is formed in a body, e.g. of a carrier, and forms a depression in the body. The term may encompass a blind recess structure or a recess structure which extends through the whole body from one surface to the opposite surface. Such a recess structure may increase a surface area of the body it is formed in.

According to an exemplary embodiment of the semiconductor device the second feature has at least one shape out of the group of shapes consisting of rectangular, square, circular, elliptic, polygonal, star like, and slot like.

In particular, the shape or form of the second feature, e.g. holes or recess structures, may be defined by a top view onto the second major surface of the carrier or semiconductor device. In principle any form or shape is possible and shapes which are easily produced may be preferred in order to reduce the complexity of the forming process of the recess structures. Typical dimensions for the features may be 1.5 mm to 3.5 mm in length, 0.5 mm to 2 mm in width and 0.1 mm to 0.5 mm in depth for rectangular recess structures or 1.5 mm to 5 mm in diameter and in length for circular recess structures and square recess structures, respectively.

According to an exemplary embodiment of the semiconductor device the second portion comprises a through hole for mounting the semiconductor device to the support. In particular, the first feature may be a through hole.

In particular, the through hole may be a fixing hole. The term "fixing hole" may particularly denote a hole which is adapted to fix the heat sink (and as such the chip package or semiconductor device) to a support or supporting structure like a substrate, printed circuit board, external heat sink (structure) or the like. For example, the fixing may be performed by screwing or plugging a pin of a supporting structure through the fixing hole. The provision of a fixing hole may provide for an easy attachment of the carrier to a support external to the semiconductor device, packaged or housed chip of which the carrier may be a part of. In particular, one or several through holes may be formed in the second portion of the carrier. The provision of through holes may be advantageous in case the semiconductor device is placed, arranged or mounted to a substrate in such a way that the second portion is not directly contacted to the substrate but is arranged in such a way that both major surfaces of the second portion are in contact with a surrounding fluidic medium, e.g. air. Such an arrangement may be achieved in case leads of the carrier or semiconductor device are plugged into holes of a substrate. Thus, also the surface area of both major surfaces is increased and therefore provides an improved contact area for heat convection.

According to an exemplary embodiment of the semiconductor device the first portion and the second portion of the carrier have the same thickness.

According to an exemplary embodiment of the semiconductor device the first portion and the second portion comprises a same material.

According to an exemplary embodiment of the semiconductor device the carrier comprises a material out of the group consisting of: copper; a copper alloy; nickel; and a nickel alloy.

In particular, the second portion of the carrier or the whole carrier may comprise or may consist of copper, nickel or alloys thereof. These materials may have a suitable high thermal conductivity and can be readily processed. Thus, it may be a suitable material for at least the second portion of the carrier. Alternatively, each material having a good thermal conductivity may be used for the carrier.

According to an exemplary embodiment of the semiconductor device the first portion is at least partially encapsulated.

According to an exemplary embodiment of the semiconductor device at least one of the two interruptions is a blind hole. Alternatively or additionally at least one of the two interruptions is a through hole.

According to an exemplary embodiment of the semiconductor device the holding area is a flat area.

According to an exemplary embodiment the semiconductor device further comprises the semiconductor chip arranged on the holding area.

According to an exemplary embodiment of the semiconductor device the recess structures are formed by one process out of the group of processes consisting of stamping, punching, etching, milling, and drilling.

The following detailed description refers to the accompanying drawings that show, by way of illustration, specific details and embodiments in which the invention may be practiced.

Figure 1:
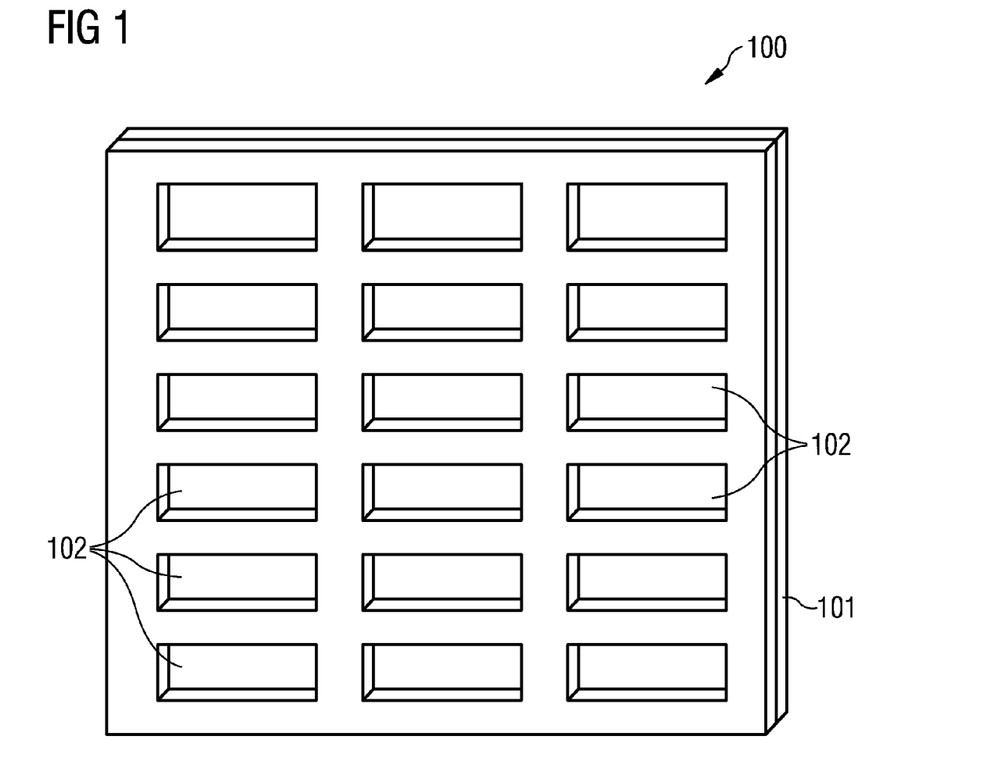
FIG. 1 shows a detail view of a heat sink.

FIG. 1 shows a portion of a carrier 100, e.g. heat sink portion of a carrier. In particular, FIG. 1 shows the heat sink portion 100 comprising a plate like heat sink body 101 of a heat conductive material, for example a metal e.g. copper or the like, and comprising a plurality of features or surface structures 102 increasing a surface area of the heat sink portion 101. In case of the embodiment of FIG. 1 the features or surface structures are formed only on one major surface (in FIG. 1 the upper major surface of the plate like body) and are formed by rectangular recess structures or blind holes 102 formed into the plate like heat sink portion 101. While the recess structures are arranged in a regular pattern according to FIG. 1 the recess structures may be arranged in an irregular pattern as well.

It should be mentioned that the features or recess structures 102 may be formed by a stamping, punching, milling, etching process into a plate like body or the body may already be formed, e.g. casted, including the recess structures. Furthermore, it should be mentioned that an orientation of the recess structures is arbitrarily.

In the case of FIG. 1 the heat sink portion 101 only comprises blind holes. Thus a first major surface (in FIG. 1 the lower major surface) still have a flat or planar surface, while a second major surface (in FIG. 1 the upper major surface) comprises a plurality of recess structures increasing the surface area of the second major surface. The flat or planar first major surface or back of the heat sink portion may provide for a good thermal contact with a substrate, like a printed circuit board (PCB) or external heat sink, so that a good heat dissipation by heat conduction may be enabled via the first major surface and a contacted PCB. At the same time the increased surface area of the second major surface may improve the heat dissipation via convection when the second surface is exposed to a fluidic medium like air. Depending on the number of recess structures or blind holes the convection surface may be increased by about 30% to 60% or even more. At the same time the consumption of material for the heat sink portion may be reduced by 10% to 30% for example. In case a relative expensive metal, e.g. copper, is used as material for the heat sink portion the reduction may lead to a significant reduction of costs for the heat sink, while increasing the surface area usable for heat convection.

FIGS. 2A to 2E show different semiconductor devices according to exemplary embodiments.

Figure 2A:
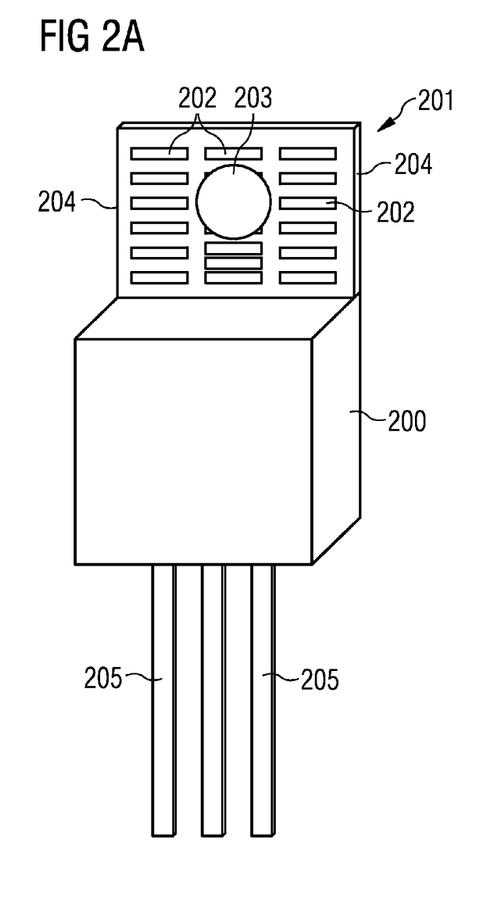
FIGS. 2A to 2E show different semiconductor devices according to exemplary embodiments.

In particular, FIG. 2A shows a semiconductor device or package 200, i.e. a chip or die (not shown) encapsulated by a mold compound. Before the encapsulation of the chip is formed by the mold compound the chip is attached to a die paddle or first portion of a lead frame or carrier. Aside from the die paddle or chip reception area the carrier comprises a heat sink portion or second portion 201 and leads or leads portion 205 which may optionally as well form conductor paths or conductors for electrically contacting the encapsulated chip. As in the example of FIG. 1, recess structures 202 are formed by rectangular shaped holes in the heat sink portion. However, according to the exemplary embodiment of FIG. 2A the holes 202 are through holes. In addition a circular central through or fixing hole 203 is shown in FIG. 2A which may be used to fix, e.g. screw or plug, the heat sink portion 201 and as such the package 200, to a substrate.

It should be noted that in the case of through holes the heat sink portion of the carrier, i.e. remaining material structures 204 of the body, are preferably of sufficient strength to maintain the stability of the heat sink portion 201 of the carrier. In general, the provision of through holes may increase the saving of material for the heat sink portion and at the same time may increase the enlarging of the surface area of the heat sink portion, thus improving the capability of the heat sink to dissipate heat by heat convection.

Figure 2B:
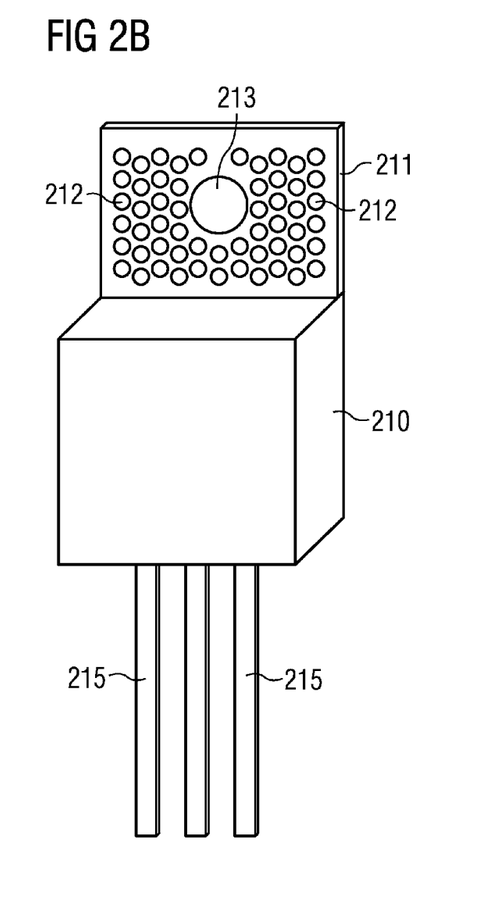

FIG. 2B shows another exemplary embodiment of recess structures which can be used for a heat sink portion. In particular, circular through holes 212 are formed in a heat sink portion 211 being part of a semiconductor device or package 210. As the embodiment of FIG. 2A the embodiment of FIG. 2B comprises a central circular hole 213 for fixing or screwing and some conductor lines 215 for electrically and/or mechanically connecting the package 210.

Figure 2C:
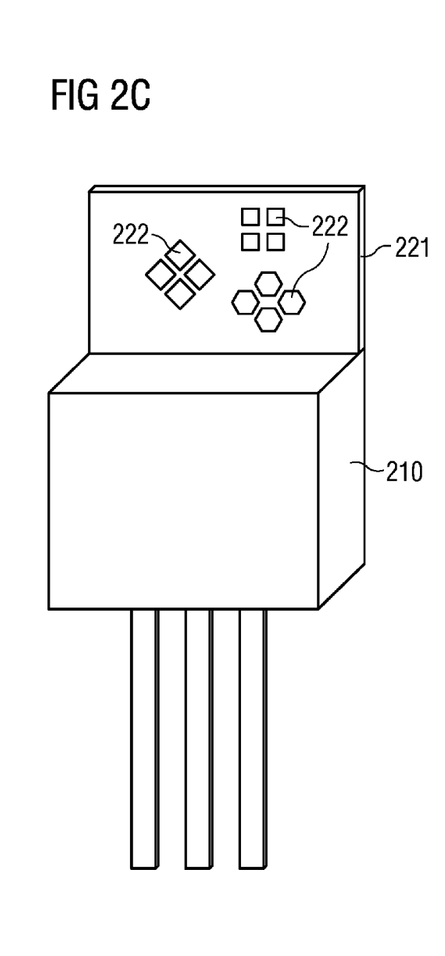

FIG. 2C shows another exemplary embodiment of recess structures or surface structures which can be used for a heat sink portion of the carrier. In particular, through holes 222 of different shapes (rhombic, square and polygonal) are formed in a heat sink portion 221 being part of a semiconductor device or package 210. It should be noted that the embodiment of FIG. 2C does not include a fixing or screw hole, contrary to the one in FIGS. 2A and 2B and to the one shown in the following described FIGS. 2D and 2E. However, it should be mentioned that the provision of such a screw hole is optional in any of the depicted examples, i.e. each of the exemplary embodiments of heat sinks portions may or may not include one or several screw hole(s) which may be arranged in the center of the heat sink or off-center.

Figure 2D:
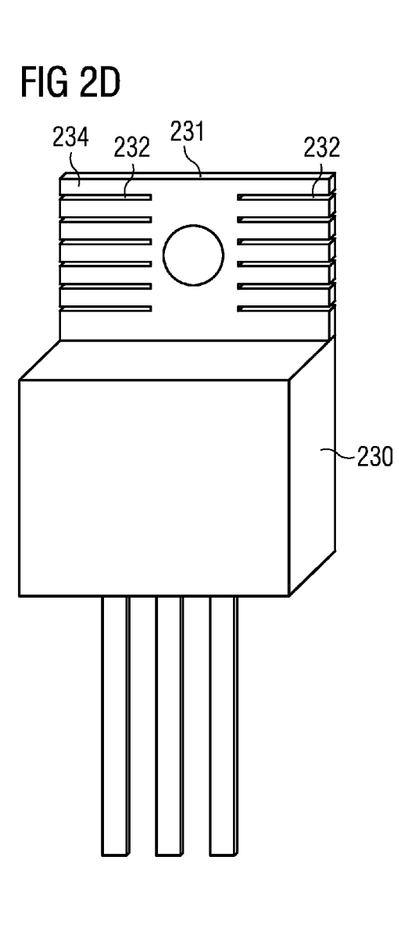
Figure 2E:
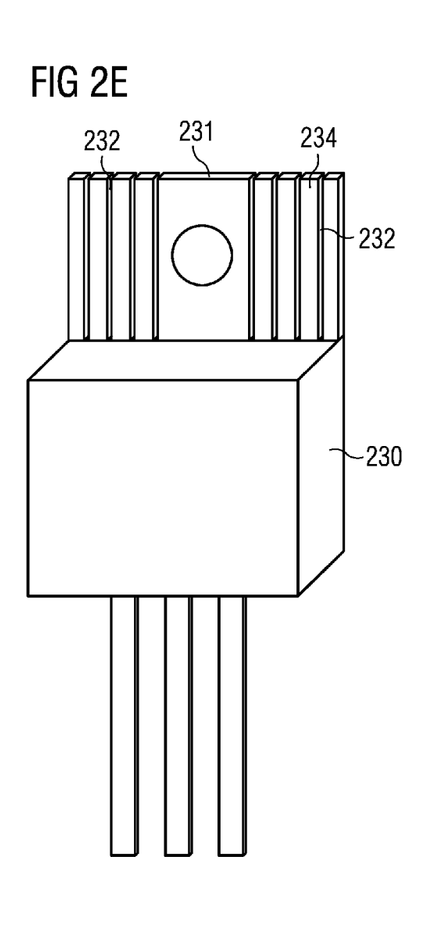

FIGS. 2D and 2E show other exemplary embodiments of recess structures of a heat sink portion 231 which can be used in order to improve heat dissipation of a package. In the case of FIGS. 2D and 2E the recess structures 232 are formed by slots which may be arranged in any suitable orientation. The slots 232 form tips 234 which as well may improve the heat dissipation of a package 230 comprising the heat sink portion 231.

Figure 3A:
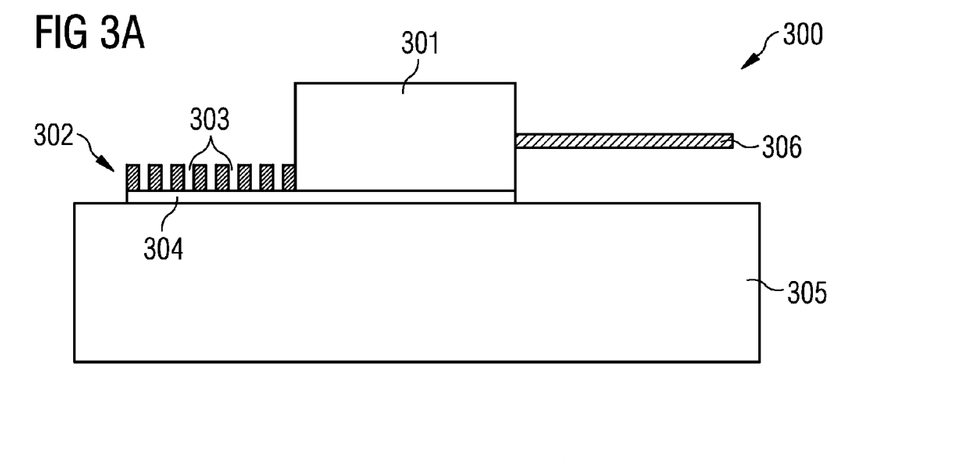
FIGS. 3A and 3B show different semiconductor devices arrangements according to an exemplary embodiment.
Figure 3B:
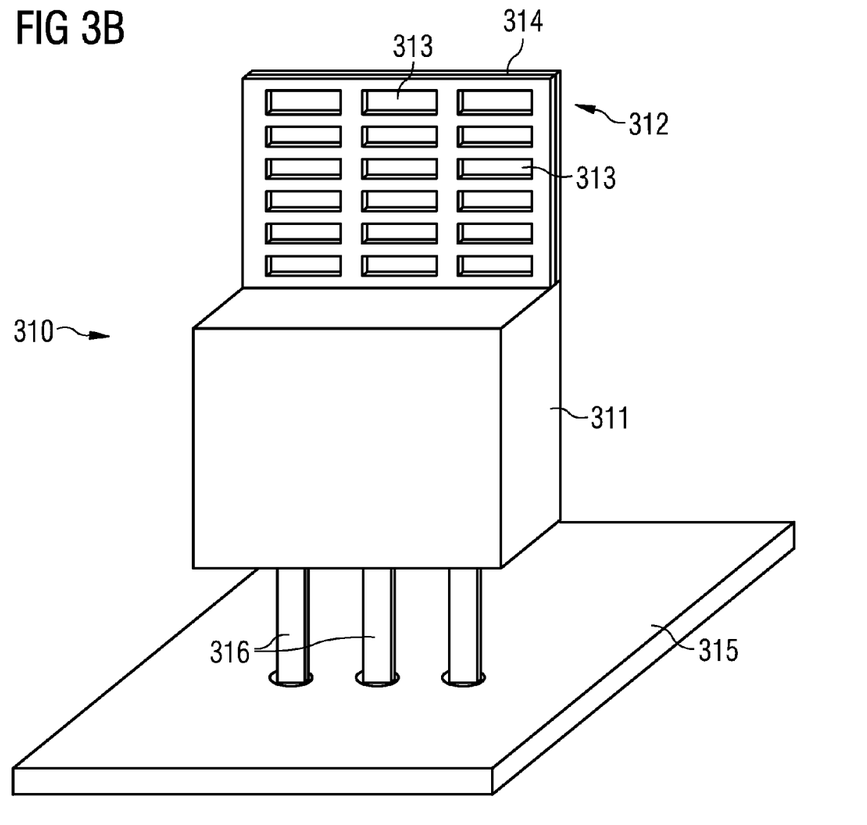

FIGS. 3A and 3B show different semiconductor device arrangements according to exemplary embodiments.

In particular, FIG. 3A shows a cross sectional view of a semiconductor device 300 comprising a package 301 comprising a carrier comprising a heat sink portion 302. The heat sink portion 302 comprises recess structures or surface structures 303 increasing the surface area of the heat sink portion 302. According to FIG. 3A the recess structures are formed by blind holes so that a continuous portion 304 of the heat sink body remains at a first major surface of the heat sink portion, while a second major surface of the heat sink portion has an increased surface area. The package 301 comprising the heat sink portion 302 is fixed or mounted to a substrate 305, e.g. a PCB or an external heat sink, e.g. by an adhesive, by surface mounting techniques, a mounting screw or the like, in such a way that the first major surface of the heat sink portion 302 is in direct contact to the substrate 305. Due to the continuos first or back major surface of the heat sink portion a good direct contact is provided between the heat sink portion 302 and the substrate 305 leading to a good heat dissipation via heat conducting. At the same time the structured second major surface has an increased surface area and thus provides a good heat dissipation via heat convection to the surrounding air. In addition FIG. 3A shows an electrical conductor path, lead or line 306 which can be used to electrically and/or mechanically connect the chip of the package 301 with external components, e.g. electric or electronic circuits. While in FIG. 3A three leads or conductor paths are shown of course the number of the leads may be different depending on the needs of the respective used chip. For example, the number of leads may be five, seven or even more. Furthermore, the conductor paths or leads do not need to be straight but may be staggered or buckled.

FIG. 3B shows another exemplary embodiment for a semiconductor device arrangement. In particular, FIG. 3B shows a schematic perspective view of a semiconductor device 310 comprising a package 311 comprising a carrier including a heat sink portion 312. The heat sink portion 312 comprises recess structures 313 increasing the surface area of the heat sink portion 312. According to FIG. 3B the recess structures are formed by blind holes so that a continuous portion 314 of the heat sink portion remains at a first major surface of the heat sink. However, the recess structures may be formed by through holes as well. In contrast to the embodiment shown in FIG. 3A the package 311 of FIG. 3B is not mounted to the a substrate 315 in such a way that the heat sink portion 312 is in direct contact with the substrate but the package 311 is mounted to the substrate 315 via electrical conductors, leads or conductor lines 316 to the substrate, e.g. by plugging the leads in holes or vias of the substrate. Thus, the heat sink portion 312 dissipate heat of the chip via convection rather than via heat conduction from the first major surface as well.

It should be noted that typical sizes of heat sink portions of a carrier or lead frame may be in the range of 2 mm to 30 mm in length, 2 mm to 30 mm in width and 0.5 mm to 5 mm in height, e.g. 2.4 mm in length and 0.285 mm in height in case of an rectangular blind hole. However, these numbers are given only as examples and may vary in a broad range according to the specific needs and/or size of the package they are part of or attached to. It should also be mentioned that when the recess structures increasing the surface area are formed by a plurality of holes some of the plurality of holes may be formed by through holes while other ones may be formed by blind holes.

Figure 4:
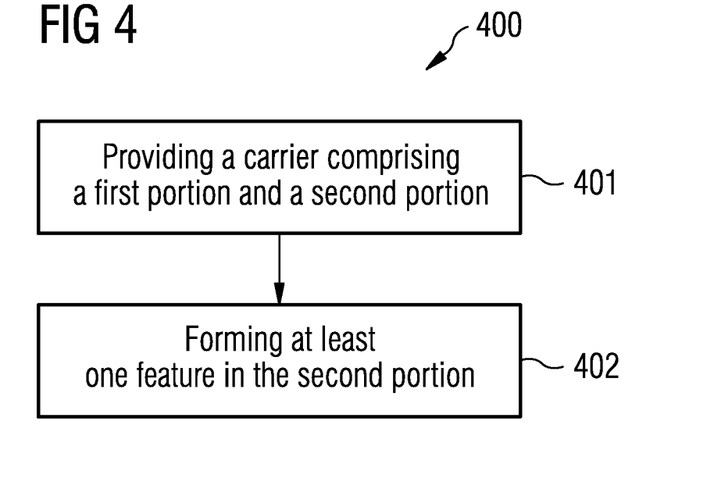
FIG. 4 shows a flow chart of a method of manufacturing a semiconductor device according to an exemplary embodiment.

FIG. 4 shows a flow chart of a method 400 of manufacturing a semiconductor device according to an exemplary embodiment. In particular, the flow chart of FIG. 4 comprises a first step 401 of providing a carrier comprising a first portion configured to hold a semiconductor chip and a second portion configured for mounting the semiconductor device to a support. For example, the carrier may be a metal sheet typically used as a blank for carriers or for forming lead frames. Then at least one feature is formed in the second portion wherein the at least one feature is configured to facilitate transfer of heat away from the first portion, wherein the at least one feature increases a surface area of the second portion. The at least one feature, e.g. a recess structure, may be formed by stamping, punching, drilling, milling, etching or any other suitable process. It may as well be that already the plate like carrier may be formed including the at least one feature already, e.g. by a molding process using a cast including the complementary surface structures already. The at least one feature may be formed with a shape corresponding to concave blind holes or through holes. After finishing the carrier the carrier may be attached to a chip and may then be mounted to an external heat sink or substrate.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor device, comprising:
a carrier, comprising:
a first portion configured to hold a semiconductor chip; and
a second portion configured for mounting the semiconductor device to a support, the second portion further comprising:
a first feature configured to be connected to the support; and
at least one second feature configured to facilitate transfer of heat away from the first portion, wherein the at least one second feature increases a surface area of the second portion,
wherein the second portion of the carrier comprises a plurality of second features, wherein at least one of the plurality of second features is a blind hole.

2. The semiconductor device according to claim 1, wherein the first portion of the carrier comprises a flat surface.

3. The semiconductor device according to claim 1, wherein the second feature has a shape selected from the group consisting of:
rectangular;
square;
circular;
elliptic;
polygonal;
star like; and
slot like.

4. The semiconductor device according to claim 1, wherein the second portion comprises a through hole for mounting the semiconductor device to the support.

5. The semiconductor device according to claim 1, wherein the first portion and the second portion of the carrier have the same thickness.

6. The semiconductor device according to claim 1, wherein the first portion and the second portion comprises a same material.

7. The semiconductor device according to claim 1, wherein the carrier comprises a material out of the group consisting of:
copper;
a copper alloy;

nickel; and a nickel alloy.

8. The semiconductor device according to claim 1, wherein the first portion is at least partially encapsulated.

9. A semiconductor device, comprising:
a carrier comprising:
a holding area configured to hold a semiconductor chip; and
a heat dissipation area comprising a planar surface, wherein the heat dissipation area comprises at least two interruptions in the planar surface, wherein at least one of the two interruptions is a blind hole.

10. The semiconductor device according to claim 9, wherein at least one of the two interruptions is a through hole.

11. The semiconductor device according to claim 9, wherein the holding area is a flat area.

12. The semiconductor device according to claim 9, further comprising the semiconductor chip arranged on the holding area.

13. A method for manufacturing a semiconductor device, the method comprising:
providing a carrier comprising a first portion configured to hold a semiconductor chip and a second portion configured for mounting the semiconductor device to a support;
forming at least one feature in the second portion wherein the at least one feature is configured to facilitate transfer of heat away from the first portion, wherein the at least one feature increases a surface area of the second portion, wherein at least one of the at least one feature is a blind hole.

14. The method for manufacturing a semiconductor device according to claim 13, wherein the at least one feature is formed by one process selected from the group of processes consisting of:
stamping;
punching;
etching;
milling; and
drilling.

* * * * *